US012743212B2

(12) United States Patent
Lang et al.

(10) Patent No.: US 12,743,212 B2
(45) Date of Patent: Sep. 22, 2026

(54) DETERMINING VOLTAGE OFFSET FOR A MEMORY OPERATION USING MEMORY BIN AND MEMORY POSITION

(71) Applicant: Micron Technology, Inc., Boise, ID (US)

(72) Inventors: Murong Lang, San Jose, CA (US); Christina Papagianni, San Jose, CA (US); Guang Hu, Mountain view, CA (US); Lei Lin, Fremont, CA (US); Zhenming Zhou, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 18/791,267

(22) Filed: Jul. 31, 2024

(65) Prior Publication Data

US 2026/0037145 A1 Feb. 5, 2026

(51) Int. Cl.

*G06F 12/00* (2006.01)
*G06F 3/06* (2006.01)
*G11C 16/26* (2006.01)
*G11C 16/04* (2006.01)
*G11C 16/08* (2006.01)

(52) U.S. Cl.

CPC .......... *G06F 3/0619* (2013.01); *G06F 3/0653* (2013.01); *G06F 3/0673* (2013.01); *G11C 16/26* (2013.01); *G11C 16/0483* (2013.01); *G11C 16/08* (2013.01)

(58) Field of Classification Search

CPC ....... G06F 3/0629; G06F 3/0659; G06F 3/067
USPC .......................................................... 711/154
See application file for complete search history.

(56) References Cited

U.S. PATENT DOCUMENTS

| | | | | |
|---|---|---|---|---|
| 11,217,320 | B1 * | 1/2022 | Sheperek | G11C 16/30 |
| 11,783,901 | B2 * | 10/2023 | Muchherla | G06F 11/0727 711/154 |
| 2022/0237094 | A1 * | 7/2022 | Sheperek | G06F 3/0679 |
| 2022/0277798 | A1 * | 9/2022 | Muchherla | G11C 29/028 |
| 2022/0375530 | A1 * | 11/2022 | Muchherla | G11C 29/021 |
| 2023/0186959 | A1 * | 6/2023 | Lang | G11C 16/08 365/189.15 |
| 2023/0214133 | A1 * | 7/2023 | Muchherla | G11C 16/3427 711/103 |
| 2023/0386578 | A1 * | 11/2023 | Xu | G11C 16/32 |
| 2023/0393991 | A1 * | 12/2023 | Chang | G06F 12/0692 |
| 2024/0170090 | A1 * | 5/2024 | Zhang | G11C 29/021 |
| 2024/0233833 | A1 * | 7/2024 | Tan | G11C 11/5642 |
| 2025/0014653 | A1 * | 1/2025 | Zhou | G11C 16/26 |

* cited by examiner

*Primary Examiner* — Mohamed M Gebril
(74) *Attorney, Agent, or Firm* — NICHOLSON DE VOS WEBSTER & ELLIOTT LLP

(57) ABSTRACT

Methods, systems, and apparatuses include receiving, by a memory subsystem, a read command from a host device to read data from a memory portion of the memory subsystem. It is determined that the memory portion includes a partial block. A memory bin is determined for the memory portion in response to determining that the memory portion includes the partial block. A position is determined for the memory portion. A voltage offset is applied to a read voltage for the memory portion using the memory bin and the position.

14 Claims, 6 Drawing Sheets

300
RECEIVE READ COMMAND FROM HOST
305
PARTIAL BLOCK?
310
N
Y
APPLY FULL BLOCK WORDLINE VOLTAGE
315
DETERMINE MEMORY BIN FOR CURRENT SUBBLOCK
320
DETERMINE WORDLINE POSITION FOR CURRENT SUBBLOCK
325
APPLY READ VOLTAGE WITH VOLTAGE OFFSET USING MEMORY BIN AND WORDLINE POSITION
330
LAST SUBBLOCK?
335
Y
N
NEXT SUBBLOCK
340

400
RECEIVE READ COMMAND FROM HOST
405
PARTIAL BLOCK?
410
N
Y
APPLY FULL BLOCK WORDLINE VOLTAGE
415
BOUNDARY WORDLINE?
420
N
Y
APPLY INNER WORDLINE PARTIAL BLOCK VOLTAGE OFFSET
425
EARLY MEMORY BIN?
430
Y
N
APPLY BOUNDARY WORDLINE PARTIAL BLOCK VOLTAGE OFFSET
435
LAST SUBBLOCK?
440
N
Y
NEXT SUBBLOCK
445

500
RECEIVE READ COMMAND FROM HOST
505
DETERMINE THAT READ COMMAND IS FOR PARTIAL BLOCK
510
DETERMINE MEMORY BIN FOR PORTION OF PARTIAL BLOCK
515
DETERMINE POSITION FOR PORTION OF PARTIAL BLOCK
520
APPLY A VOLTAGE OFFSET TO A READ VOLTAGE FOR THE PORTION USING THE MEMORY BIN AND THE POSITION
525

600
PROCESSING DEVICE
602
INSTRUCTIONS
626
VOLTAGE OFFSET
DETERMINATION
COMPONENT
113
STATIC MEMORY
606
BUS 630
MAIN MEMORY
604
INSTRUCTIONS
626
VOLTAGE OFFSET
DETERMINATION
COMPONENT
113
DATA STORAGE SYSTEM
618
MACHINE-READABLE MEDIUM
624
INSTRUCTIONS
626
VOLTAGE OFFSET
DETERMINATION
COMPONENT
113
NETWORK
INTERFACE DEVICE
608
NETWORK
620

DETERMINING VOLTAGE OFFSET FOR A MEMORY OPERATION USING MEMORY BIN AND MEMORY POSITION

TECHNICAL FIELD

The present disclosure generally relates to determining voltage offsets for memory read operations, and more specifically, relates to determining voltage offsets for memory read operations using memory bins and memory position.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
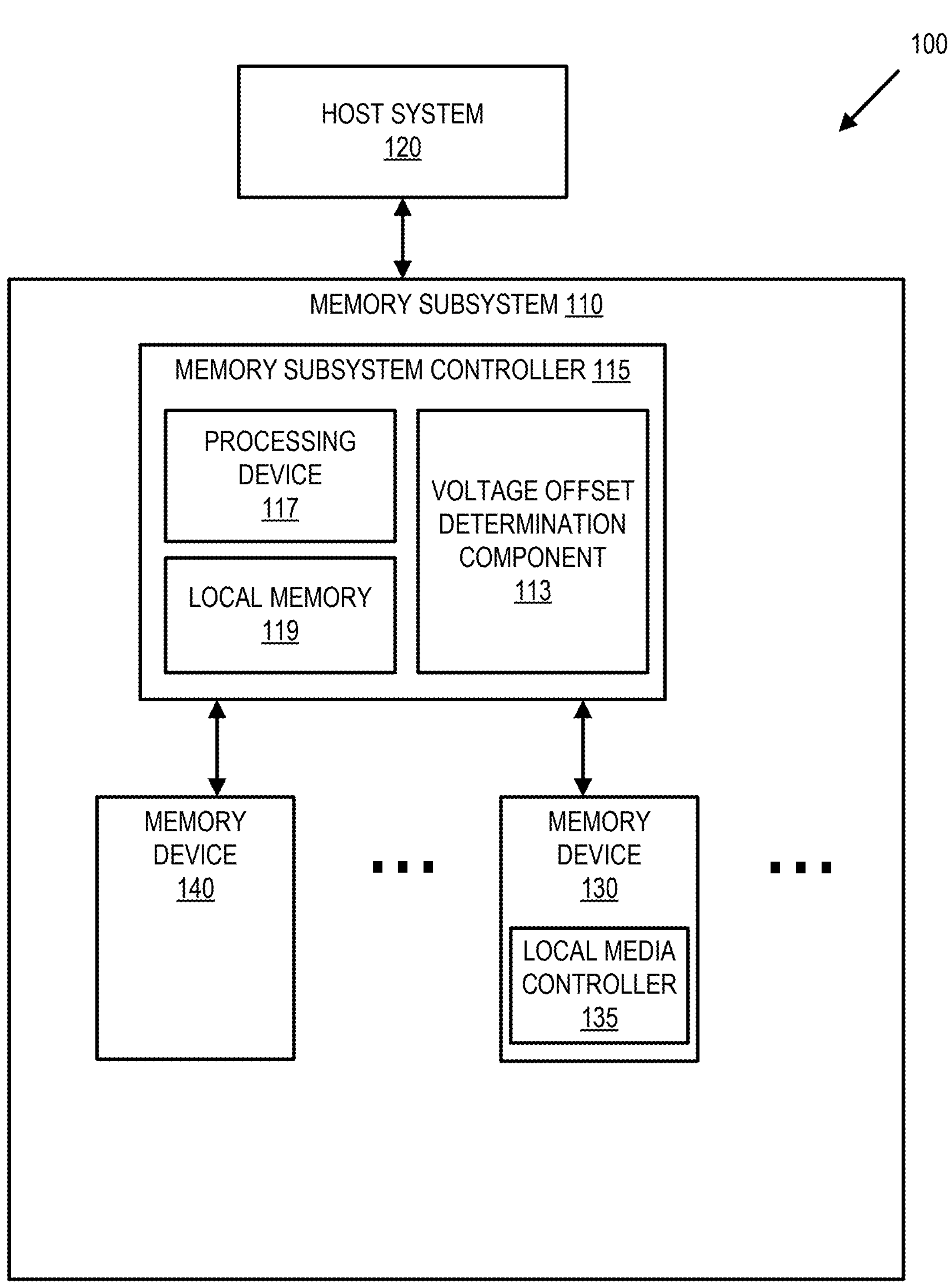
FIG. 1 illustrates an example computing system that includes a memory subsystem in accordance with some embodiments of the present disclosure.

Aspects of the present disclosure are directed to determining voltage offsets for memory operations using memory bins and memory positions in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units identified by a logical unit number (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), quad-level cells (QLCs), and penta-level cells (PLCs). For example, an SLC can store one bit of information and has two logic states while a QLC can store sixteen bits of information and has sixteen logic states.

In conventional memory systems, memory can degrade over time due to a variety of factors including manufacturing defects, age, and environmental stresses. This degradation is oftentimes not even across memory blocks, resulting in memory subsystems implementing partially good blocks where only part of a memory block is still in use while the rest is retired due to the degradation. Additionally, some memory subsystems use partial blocks (PBs) for improved memory management (e.g., smaller granularity for memory operations, more even wear leveling, more efficient garbage collection, etc.). When implementing these partial block architectures, however, conventional memory systems encounter difficulties. For example, these partial block architectures can result in abnormal voltage distributions for memory cells that belong to partial blocks. This can be due to, for example, charge migration from the used portion of the partial block to memory cells in the unused portion, differences in string currents between the memory cells in the used portion and the unused portion, etc. These difficulties with abnormal voltage distributions are particularly acute in boundary portions of the partial blocks. For example, wordlines in the used portion of the memory block that neighbor the unused portion have altered voltage distributions due to their proximity to the unused portion and the effects mentioned above.

In order to account for these difference in voltage distributions, conventional memory systems apply voltage offsets to read voltages when reading data stored in partial blocks. In particular, memory systems apply one voltage offset to inner wordlines (e.g., wordlines that do not border the unused portion of the partial block) and apply a larger voltage offset to boundary wordlines (e.g., wordlines that do border the unused portion of the partial block). Memory subsystems can determine whether a wordline is an inner wordline or a boundary wordline, and therefore which voltage offset to apply, using a last written page (LWP) value stored in buffer memory. These techniques, however, can cause some unintended consequences. For example, when performing a read on a partial block that was recently written, it is possible that the buffer memory has not been updated, resulting in an incorrect value for the LWP. Because the memory subsystem is not aware of the correct LWP, it can apply a larger voltage offset (e.g., intended for a boundary wordline) to an inner wordline, resulting in overcompensation and high raw bit error rate, which can result in an unnecessary refresh operation. Additionally, the change in voltage distribution for inner wordlines and boundary wordlines can move in different directions (e.g., decreased charge loss for inner wordlines and increased charge loss for boundary wordlines), resulting in further errors in applying the voltage offsets when data has been stored for longer periods of time.

Aspects of the present disclosure address the above and other deficiencies by determining voltage offsets using memory bins and memory positions. For example, the memory subsystem can use memory bins which group portions of memory (e.g., wordlines) based on how long that memory portion has retained data and the temperature of the memory portion during the data retention period. By determining voltage offsets using both these memory bins and whether the wordline is a boundary wordline or an inner wordline, the memory subsystem can better track the changes in voltage distribution over long periods of data retention, reducing the error rate and consequently triggering fewer unnecessary refresh operations. Additionally, because the memory bins correspond with the length of time that a memory portion has retained data, the memory subsystem can apply lesser voltage offsets to boundary wordlines early in life when the LWP problem is more likely to occur, resulting in a more accurate voltage offset, a lower raw bit error rate, and consequently a lower trigger rate for unnecessary refresh operations. Accordingly, the memory subsystem preserves system resources (e.g., time and power) by reducing the amount of unnecessary refresh operations.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processing device such as a processor chipset and a software stack executed by the processor chipset. The processor chipset can include one or more cores, one or more caches, a memory controller (e.g., NVDIMM controller), and/or a storage protocol controller (e.g., a peripheral component interconnect express (PCIe) controller, a serial advanced technology attachment (SATA) controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a SATA interface, including a mini-SATA (mSATA) interface, a PCIe interface, including a mini PCIe (mPCIE) interface, a Non-Volatile Memory Express (NVMe) interface, a universal serial bus (USB) interface, an a Fibre Channel, Serial Attached SCSI (SAS), a Small Computer System Interface (SCSI), a double data rate (DDR) memory bus, a dual in-line memory module (DIMM) interface (e.g., DIMM socket interface that supports Double Data Rate (DDR)), an Advanced Host Controller (AHCI) interface, an Open NAND Flash Interface (ONFI) interface, a Double Data Rate (DDR) interface, a Low Power Double Data Rate (LPDDR) interface, any other interface, and/or combinations of these interfaces. The physical host interface can be used to transmit data between the host system 120 and the memory subsystem 110. The host system 120 can further utilize an NVMe interface to access components (e.g., memory devices 130 and 140) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via the same communication connection, multiple separate communication connections, and/or a combination of communication connections.

The memory devices 130 and 140 can include any combination of the different types of non-volatile memory devices and/or volatile memory devices. The volatile memory devices (e.g., memory device 140) can be, but are not limited to, random-access memory (RAM), such as dynamic random-access memory (DRAM), synchronous dynamic random-access memory (SDRAM), video random-access memory (VRAM), and cache memory.

Some examples of non-volatile memory devices (e.g., memory device 130) include negative-and (NAND) type flash memory devices and write-in-place type memory devices, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random-access memory (FeRAM), magneto random-access memory (MRAM), Spin Transfer Torque (STT)-MRAM, nano-RAM (NRAM), silicon-oxide-nitride-oxide-silicon (SONOS) memory, conductive bridging RAM (CBRAM), resistive random-access memory (RRAM), oxide based RRAM (OxRAM), negative-or (NOR) flash memory, and erasable programmable read-only memory (EPROM), including electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The buffer memory of subsystem controller 115 can include any of the volatile or non-volatile memory types mentioned above including combinations thereof. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in memory subsystem 110 (e.g., stored in a local memory 119). In some examples, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processing device or controller separate from the memory subsystem 110).

In general, the memory subsystem controller 115 can receive commands or operations from the host system 120 and can convert the commands or operations into instructions or appropriate commands to achieve the desired access to the memory devices (e.g., memory devices 130 and/or 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA) and/or namespace) and a physical address (e.g., physical block address) that are associated with the memory devices (e.g., memory devices 130 and/or 140). The memory subsystem controller 115 can further include host interface circuitry to communicate with the host system 120 via the physical host interface. The host interface circuitry can convert the commands received from the host system into command instructions to access the memory devices (e.g., memory devices 130 and/or 140) as well as convert responses associated with the memory devices into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices (e.g., memory devices 130 and/or 140).

In some embodiments, the memory devices (e.g., memory devices 130 and/or 140) include local media controllers 135 that operate in conjunction with memory subsystem controller 115 to execute operations on one or more memory cells of the memory devices (e.g., memory devices 130 and/or 140). An external controller (e.g., memory subsystem controller 115) can externally manage the memory devices (e.g., perform media management operations on the memory devices 130 and/or 140). In some embodiments, a memory device (e.g., memory device 130) is a managed memory device, which is a raw memory device combined with a local controller (e.g., local controller 135) for media management within the same memory device package. An example of a managed memory device is a managed NAND (MNAND) device.

The memory subsystem 110 includes a voltage offset determination component 113 that determines voltage offsets to apply to memory portions using the memory bin to which the memory portion belongs and the relative position of the memory portion. In some embodiments, the controller 115 includes at least a portion of the voltage offset determination component 113. For example, the controller 115 can include a processing device 117 configured to execute instructions stored in local memory 119 for performing the operations described herein. In some embodiments, a voltage offset determination component 113 is part of the host system 120, an application, or an operating system.

The voltage offset determination component 113 determines a voltage offset to apply to wordlines during a read operation using the memory bin that the wordline belongs to and whether the wordline is an inner or boundary wordline. Further details with regards to the operations of the voltage offset determination component 113 are described below.

Figure 2:
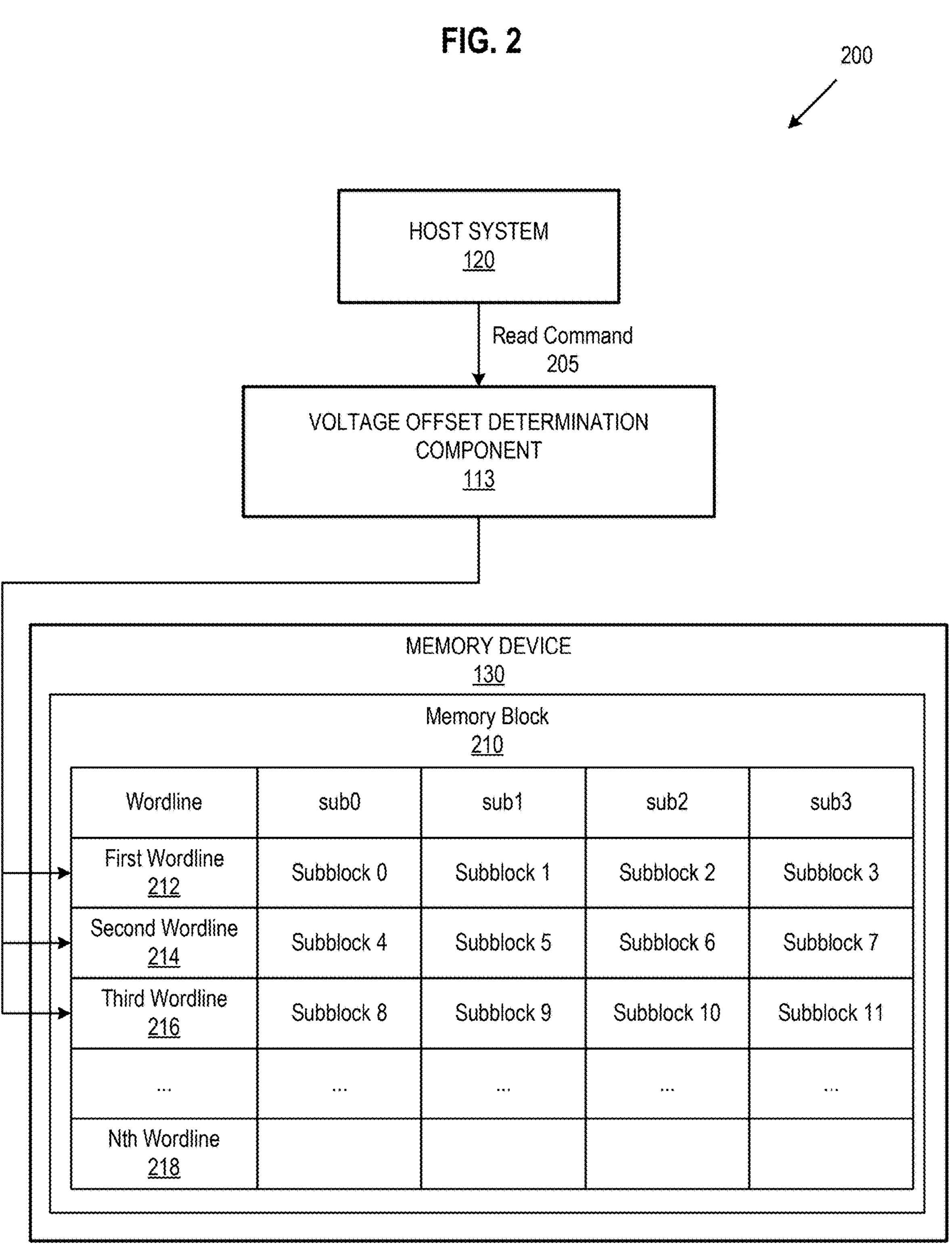
FIG. 2 illustrates an example computing system that includes a voltage offset determination component in accordance with some embodiments of the present disclosure.

FIG. 2 illustrates another example computing system 200 that includes a voltage offset determination component 113 in accordance with some embodiments of the present disclosure. Computing system 200 also includes a memory device 130 including memory block 210. As shown in FIG. 2, memory block 210 includes first wordline 212, second wordline 214, third wordline 216, and Nth wordline 218. Each of first through Nth wordlines 212, 214, 216, and 218 includes subblocks. For example, first wordline 212 includes subblocks 0, 1, 2, and 3, second wordline 214 includes subblocks 4, 5, 6, and 7, and third wordline 216 includes subblocks 8, 9, 10, and 11. In some embodiments, each of the subblocks represents pages of the memory device. For example, subblocks 0-3 represents pages of first wordline 212, subblocks 4-7 represent pages of second wordline 214, and subblocks 8-11 represent pages of third wordline 216. Although the embodiment shown in FIG. 2, illustrates memory block 210 as being composed of four subblocks per wordline, memory block 210 can be composed of any number/architecture of subblocks and wordlines.

As shown in FIG. 2, host system 120 sends read command 205 to voltage offset determination component 113. Voltage offset determination component 113 receives read command 205 and determines a memory block to which read command 205 is directed. For example, voltage offset determination component 113 receives read command 205 including a memory address and determines that read command 205 is directed to memory block 210.

In some embodiments, voltage offset determination component 113 determines whether memory block 210 is a partial block or a full block. For example, voltage offset determination component 113 maintains a look-up table in local memory (e.g., local memory 119 of FIG. 1) of memory blocks that are partial blocks. In such an example, voltage offset determination component 113 uses the memory address to determine that memory block 210 is a partial block. A partial block is a memory block that has only been partially programmed. For example, the memory block includes valid data for subblocks 0-8 but does not include valid data for the remaining subblocks (e.g., subblocks 9-11 of third wordline 216 and the remaining subblocks of the fourth wordline through Nth wordline 218. In some embodiments, a partial block includes partially good blocks, such as memory blocks that have a portion retired (e.g., due to decreased reliability).

In response to receiving read command 205 identifying memory block 210 as a partial block, voltage offset determination component 113 performs a read operation on subblock 0 of first wordline 212. For example, voltage offset determination component 113 receives read command 205 with a memory address identifying first wordline 212 of memory block 210 and applies a read voltage to subblock 0 of first wordline 212 to determine the state of memory cells of first wordline 212. In some embodiments, voltage offset determination component 113 applies a read voltage with a voltage offset based on a memory bin for first wordline 212. For example, voltage offset determination component 113 retrieves a memory bin look-up table from local memory (e.g., local memory 119 of FIG. 1) identifying which wordlines belong to which memory bins of memory device 130 and identifies the memory bin using the memory address of subblock 0 and/or first wordline 212. In one example, voltage offset determination component 113 determines that first wordline 212 belongs to memory bin 0.

In some embodiments, voltage offset determination component 113 maintains the memory bin look-up table based on the age of data stored in memory block 210 and the temperature of memory device 130 during that age of storage. For example, voltage offset determination component 113 tracks when data is written to a wordline of memory block 210 (e.g., first wordline 212) and tracks the temperature of first wordline 212, the temperature of memory block 210, and/or the temperature of memory devices 130 during the age of data storage. In some embodiments, voltage offset determination component 113 tracks the temperature through an accumulation of temperature values, an average temperature, a mean temperature, or similar methods. In some embodiments, voltage offset determination component 113 assigns earlier bins of the look-up table to data with lower storage ages. For example, wordlines with data that has been freshly written are assigned to memory bin 0 and voltage offset determination component 113 updates the memory bin as the data of the wordlines age and/or based on the temperature of the wordline, memory block, and/or memory device during storage. Accordingly, in such embodiments, earlier memory bins are associated with recently written data whereas later memory bins are associated with data written a longer time ago. Additionally, in such embodiments, portions of data that would otherwise be in the same memory bin (e.g., due to the age of the data) are put into memory bins based on the temperature of the memory device (e.g., wordline, memory block, and/or memory device) during storage. For example, a wordline that experienced higher temperatures during storage would be placed in a later memory bin (i.e., corresponding to wordlines with data with greater age) than a wordline that experienced lower temperatures during storage even if the wordlines had the same age.

In some embodiments, voltage offset determination component 113 applies a read voltage (e.g., a full block read voltage) offset by a voltage offset based on a position for first wordline 212. For example, voltage offset determination component 113 retrieves a LWP value from local memory (e.g., local memory 119 of FIG. 1) for memory block 210 identifying the last page that was written to memory block 210 and determines the position for first wordline 212 using the LWP value. In one example, voltage offset determination component 113 retrieves a LWP value identifying subblock 8 of third wordline 216 for memory block 210 and therefore determines that first wordline 212 is an inner wordline since it does not include the page identified by the LWP. Voltage offset determination component 113 determines the voltage offset to apply during a read operation on first wordline 212 using the position of first wordline 212 as an inner wordline. For example, voltage offset determination component 113 applies a lesser voltage offset for inner wordlines than for boundary wordlines (e.g., due to the increased charge loss from boundary wordlines to the unused portion of the partial block).

In some embodiments, voltage offset determination component 113 determines a voltage offset value to apply to the wordline voltage when performing a read operation on first wordline 212 using both the memory bin and the position. For example, voltage offset determination component 113 retrieves a voltage offset look-up table from local memory (e.g., local memory 119 of FIG. 1) and determines a voltage offset from the voltage offset look-up table that corresponds with an inner wordline and memory bin 0. Voltage offset determination component 113 performs a read operation on subblocks 0-3 of first wordline 212 using a read voltage (e.g., default full block read voltage) offset by the determined voltage offset.

In some embodiments, the voltage offsets for boundary wordlines are less for early memory bins (e.g., most recently written data) and greater for later memory bins (e.g., least recently written data). Accordingly, as the age of the data stored increases for boundary wordlines, the voltage offset increases as well. This increase in the voltage offset for boundary wordlines reflects the charge loss from the boundary wordlines to the unused wordlines of the memory block, allowing voltage offset determination component 113 to compensate for the charge loss over time and improve the reliability of the data stored. For example, as shown in Table 1 below, the voltage offset for boundary wordlines increases from −10 in memory bin 0 to −18 for memory bin 10. It shall be appreciated that when discussing voltage offsets, the degree of the voltage offset (e.g., greater or less) denotes the absolute value of the voltage offset. Accordingly, the voltage offset of −18 in Table 1 (e.g., representing the voltage offset for the L7 memory state level of boundary wordlines in memory bin 10) is greater than the voltage offset of −10 (e.g., representing the voltage offset for the L7 memory state level of boundary wordlines in memory bin 0).

Similarly, in some embodiments, the voltage offsets for inner wordlines are greater for early memory bins and less for later memory bins. Accordingly, as the age of the data stored increases for inner wordlines, the voltage offset decreases. This decrease in voltage offset for inner wordlines reflects the reduction in string current for inner wordlines which decreases the charge loss rate when compared to wordlines in full blocks. For example, as shown in Table 1 below, the voltage offset for inner wordlines decreases from −10 in memory bin 0 to −7 for memory bin 10.

In some embodiments, as shown in Table 1 below, voltage offset determination component 113 determines the voltage offset for different memory state levels of the subblock and/or wordline. For example, the voltage distributions for different memory states can have different degrees of charge loss/voltage threshold shift over time, resulting in different voltage offsets for the different memory state levels of the memory device. Although illustrated as including memory state levels L7 and L6 implying the bit density of memory block 210 is at least a TLC, memory devices of any bit density may be used and therefore any number of memory state levels can be included. In some embodiments, voltage offset determination component 113 applies read voltages to a subblock with different voltage offsets for the different memory state levels. For example, voltage offset determination component 113 performs a read operation on subblock 0 by applying multiple read strobes with voltage offsets based on the position of subblock 0, the memory bin of subblock 0, and the memory state level for the current read strobe.

TABLE 1

| Position | Level | Memory Bin 0 | Memory Bin 1 | . . . | Memory Bin 9 | Memory Bin 10 |
|---|---|---|---|---|---|---|
| Boundary | L7 | −10 | −11 | . . . | −17 | −18 |
| Inner | L7 | −11 | −10 | . . . | −8 | −7 |
| Boundary | L6 | −9 | −10 | . . . | −16 | −17 |
| Inner | L6 | −11 | −10 | . . . | −8 | −7 |
| . . . | . . . | . . . | . . . | . . . | . . . | . . . |

In one embodiment, voltage offset determination component 113 applies the same voltage offset for inner wordlines regardless of their memory bin and applies a voltage offset to boundary wordlines based on their memory bin. For example, voltage offset determination component 113 applies an inner wordline voltage offset to all inner wordlines, applies the same inner wordline voltage offset to boundary wordlines belonging to a subset of memory bins (e.g., memory bins 0 and 1), and applies a boundary wordline voltage offset to all other boundary wordlines (e.g., excluding memory bins 0 and 1). In such an embodiment, voltage offset determination component 113 can reduce the negative results from the LWP value not being updated in buffer memory while maintaining reduced firmware complexity. For example, as explained above, the highest risk for the LWP value not being updated is for recently written memory (e.g., early memory bins). Accordingly, by applying inner wordline voltage offsets for boundary wordlines in early memory bins, voltage offset determination component 113 reduces the risk of incorrectly triggering a refresh operation. Further details are discussed with reference to FIG. 4.

In some embodiments, voltage offset determination component 113 performs a read operation on second wordline 214. For example, voltage offset determination component 113 determines the position for second wordline 214 as an inner wordline (e.g., because LWP identifies subblock 8 of third wordline 216) and determines the memory bin for second wordline 214 as memory bin 0 (e.g., because second wordline 214 was recently programmed). Voltage offset determination component 113 uses the position and memory bin for second wordline 214 to determine a voltage offset for second wordline 214 and performs a read operation on subblocks 4-7 of second wordline 214 using a read voltage (e.g., full block read voltage) offset by the determined voltage offset. In one embodiment, even though subblocks 0-8 include programmed data, the buffer memory has not updated the LWP value to subblock 8 of third wordline 216. Instead, the LWP value is subblock 7 of second wordline 214. In such an embodiment, voltage offset determination component 113 determines a voltage offset for second wordline 214 based on the incorrect assumption that second wordline 214 is a boundary wordline. In such an embodiment, however, because second wordline 214 belongs to memory bin 0, the difference between the voltage offset for a boundary wordline and an inner wordline is comparatively small (e.g., referring to Table 1, boundary wordline voltage offset for L7 is −10 and inner wordline voltage offset for L7 is −11). Accordingly, the probability of incorrectly triggering a refresh operation is also comparatively small. Because the problem of the buffer memory not updating the LWP is generally limited to data that has been recently written, there is a substantially lower probability for this problem to occur for later memory bins where the difference between voltage offsets for boundary wordlines and inner wordlines is more substantial.

In some embodiments, voltage offset determination component 113 performs a read operation on third wordline 216. For example, voltage offset determination component 113 determines the position for third wordline 216 as a boundary wordline (e.g., because LWP identifies subblock 8 as belonging to third wordline 216) and determines the memory bin for third wordline 216 as memory bin 0 (e.g., because third wordline 216 was recently programmed). Voltage offset determination component 113 uses the position and memory bin for third wordline 216 to determine a voltage offset for third wordline 216 and performs a read operation on subblock 8 of third wordline 216 using a read voltage (e.g., full block read voltage) offset by the determined voltage offset.

Figure 3:
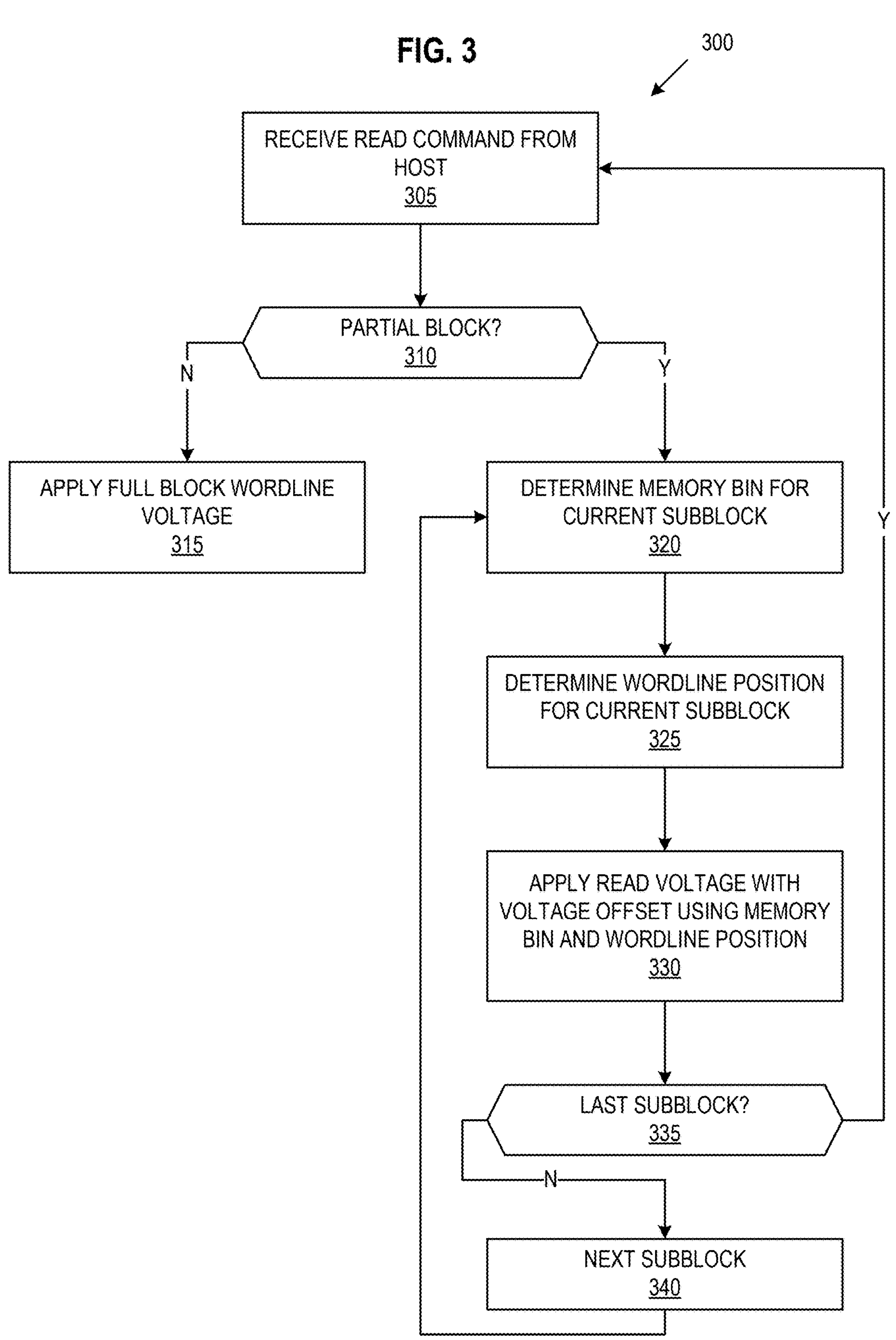
FIG. 3 is a flow diagram of an example method to determine voltage offsets using memory bins and memory positions in accordance with some embodiments of the present disclosure.

FIG. 3 is a flow diagram of an example method 300 to determine voltage offsets using memory bins and memory positions, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the voltage offset determination component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives a read command from a host system. For example, voltage offset determination component 113 receives read command 205 from host system 120 to read data from memory device 130.

In some embodiments, the read command includes a memory address. For example, read command 205 includes a memory address identifying memory block 210. Further details regarding receiving a read command from a host system are described with reference to FIG. 2.

At operation 310, the processing device determines whether the read command is directed to a partial block. For example, voltage offset determination component 113 uses the memory address identifying memory block 210 for read command 205 and determines whether memory block 210 is a full block or a partial block. In some embodiments, the processing device retrieves a look-up table from local memory (e.g., local memory 119 of FIG. 1) and determines whether the read command is directed to a partial block using the look-up table (e.g., using the memory address). If the processing device determines that the read command is directed to a partial block, the method 300 proceeds to operation 320. If the processing device determines that the read command is not directed to a partial block, the method 300 proceeds to operation 315. Further details regarding determining whether the read command is directed to a partial block are described with reference to FIG. 2.

At operation 315, the processing device applies a full block wordline voltage. For example, voltage offset determination component 113 applies read voltages with no voltage offset (e.g., a full block read voltage) during the read operation. In some embodiments, the processing device determines the full block wordline voltage using the memory address. For example, voltage offset determination component 113 retrieves a look-up table from local memory (e.g., local memory 119 of FIG. 1) and determines a wordline voltage using the memory address from read command 205.

At operation 320, the processing device determines a memory bin for the current subblock. For example, voltage offset determination component 113 retrieves a memory bin for subblock 0 of memory block 210 from a look-up table. In some embodiments, the processing device determines the memory bin for the subblock based on the wordline to which the subblock belongs. For example, voltage offset determination component 113 uses a memory bin associated with first wordline 212 for subblocks 0-3. Further details regarding determining a memory bin are discussed with reference to FIG. 2.

At operation 325, the processing device determines a wordline position for the current subblock relative to the unused portion of the partial block. For example, voltage offset determination component 113 determines if the wordline is an inner wordline or a boundary wordline. Voltage offset determination component 113 differentiates between inner and boundary wordlines by determining whether a LWP value of buffer memory (e.g., local memory 119 of FIG. 1) includes a subblock belonging to the same wordline as the current subblock. If the LWP value does not include a subblock belonging to the same wordline, the processing device determines that the wordline is an inner wordline. If the LWP value does include a subblock belonging to the same wordline, the processing device determines that the wordline is a boundary wordline. In some embodiments, the processing device determines the wordline position for the subblock based on the wordline to which the subblock belongs. For example, voltage offset determination component 113 determines whether the wordline position is a boundary wordline or an inner wordline based on whether LWP value includes a subblock belonging to first wordline 212 (e.g., inner wordline if first wordline 212 does not include LWP value and boundary wordline if first wordline 212 does include LWP value). Further details regarding determining a wordline position for the current subblock are discussed with reference to FIG. 2.

At operation 330, the processing device applies a read voltage with voltage offset using the memory bin and the wordline position. For example, voltage offset determination component 113 retrieves a look-up from local memory (e.g., local memory 119 of FIG. 1) and retrieves a voltage offset associated with the wordline position and the memory bin. Voltage offset determination component 113 applies the retrieved read voltage offset to the default full block read voltage. In some embodiments, as illustrated in Table 1, the processing device applies a read voltage for boundary wordlines with a lesser voltage offset for earlier memory bins and a greater voltage offset for later memory bins. In some embodiments, as illustrated in Table 1, the processing device applies a read voltage for inner wordlines with a greater voltage offset for earlier memory bins and a lesser voltage offset for later memory bins. In some embodiments, as illustrated in Table 1, the processing device applies different offsets for different memory state levels using the wordline position and the memory bin. Further details regarding applying a read voltage with a voltage offset using the memory bin and wordline position are discussed with reference to FIG. 2.

At operation 335, the processing device determines whether the current subblock is the last subblock to be read. For example, voltage offset determination component 113 determines whether there is another subblock to read in the read command 205. If the processing device determines that the current subblock is the last subblock, the method 300 returns to operation 305 to process the next read command. If the processing device determines that the current subblock is not the last subblock, the method 300 proceeds to operation 340.

At operation 340, the processing device moves to the next subblock. For example, voltage offset determination component 113 proceeds to determine the memory bin for the subsequent subblock of read command 205.

Figure 4:
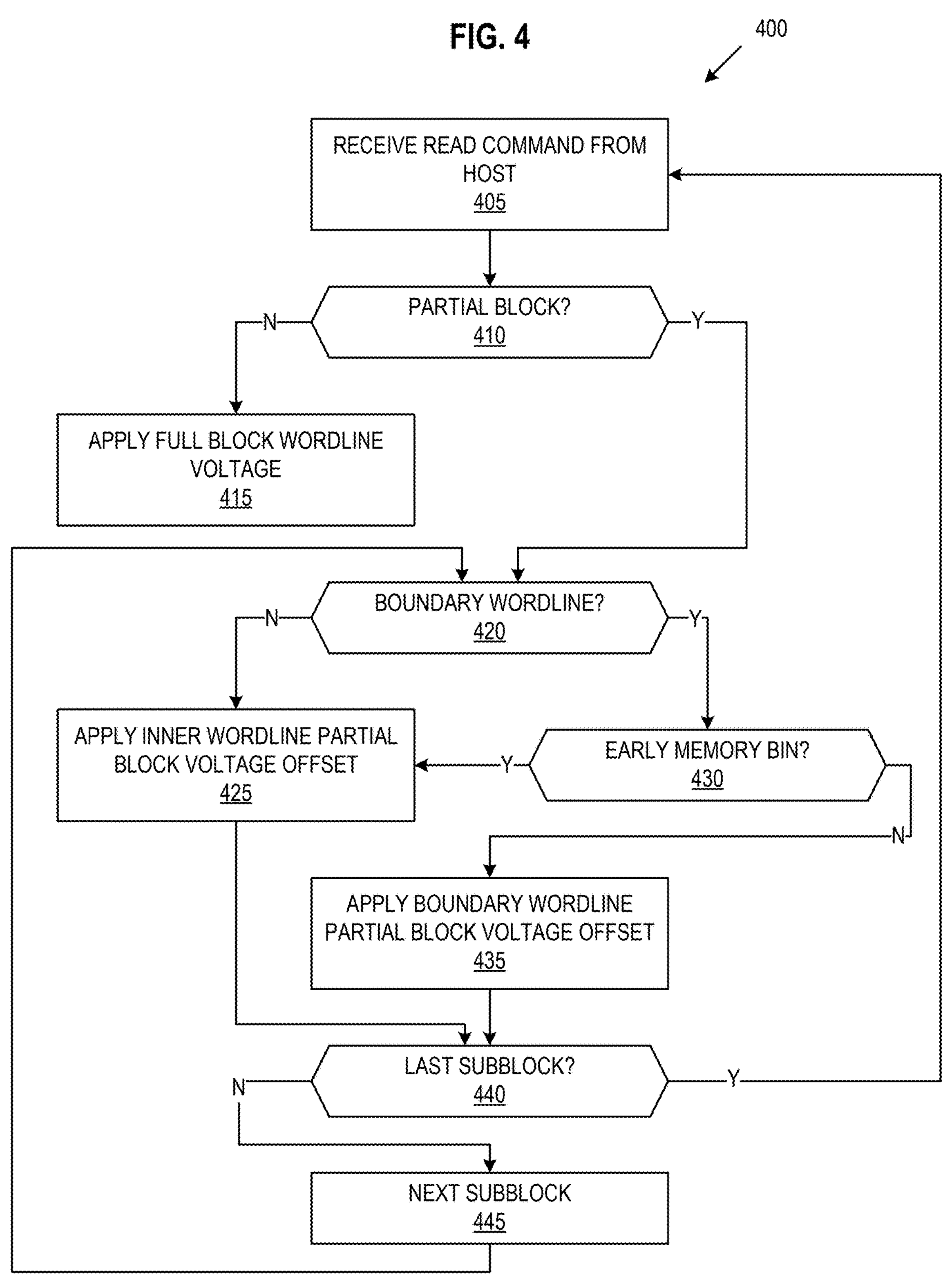
FIG. 4 is another flow diagram of an example method to determine voltage offsets using memory bins and memory positions in accordance with some embodiments of the present disclosure.

FIG. 4 is a flow diagram of an example method 400 to determine voltage offsets using memory bins and memory positions, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the voltage offset determination component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a read command from a host system. For example, voltage offset determination component 113 receives read command 205 from host system 120 to read data from memory device 130. Further details regarding receiving a read command from a host system are described with reference to FIG. 2.

At operation 410, the processing device determines whether the received read command is for a partial block. For example, voltage offset determination component 113 uses the memory address identifying memory block 210 for read command 205 and determines whether memory block 210 is a full block or a partial block. Further details regarding determining whether the read command is directed to a partial block are described with reference to FIG. 2.

At operation 415, the processing device applies a full block wordline voltage. For example, voltage offset determination component 113 applies read voltages with no voltage offset during the read operation. In some embodiments, the processing device determines the full block wordline voltage using the memory address. For example, voltage offset determination component 113 retrieves a look-up table from local memory (e.g., local memory 119 of FIG. 1) and determines a wordline voltage using the memory address from read command 205.

At operation 420, the processing device determines whether the current subblock is in a boundary wordline. For example, voltage offset determination component 113 determines whether a LWP value of buffer memory (e.g., local memory 119 of FIG. 1) includes a subblock belonging to the same wordline as the current subblock. If the LWP value includes a subblock belonging to the same wordline, the processing device determines that the wordline is a boundary wordline. If the LWP value does not include a subblock belonging to the same wordline, the processing device determines that the wordline is not a boundary wordline. If the processing device determines that the current subblock is in a boundary wordline, the method 400 proceeds to operation 430. If the processing device determines that the current subblock is not in a boundary wordline, the method 400 proceeds to operation 425. Further details regarding determining whether the current subblock is in a boundary wordline are described with reference to FIGS. 2 and 3.

At operation 425, the processing device applies an inner wordline partial block voltage offset. For example, voltage offset determination component 113 retrieves a voltage offset from local memory (e.g., local memory 119 of FIG. 1) for an inner wordline of a partial block and performs a read operation on the current subblock using a read voltage offset by the retrieved voltage offset. Further details regarding applying an inner wordline partial block voltage offset are described with reference to FIG. 2.

At operation 430, the processing device determines whether the memory bin for the current subblock is an early memory bin. For example, voltage offset determination component 113 determines whether the memory bin for the current subblock is memory bin 0 or memory bin 1. In some embodiments, the processing device determines whether the memory bin satisfies a memory bin threshold. For example, voltage offset determination component 113 determines whether the memory bin for the current subblock is less than a memory bin threshold (e.g., memory bin 2) and is therefore an early memory bin or whether the memory bin for the current subblock is greater than or equal to the memory bin threshold and is therefore a later memory bin. If the processing device determines that the memory bin for the current subblock is an early memory bin, the method 400 proceeds to operation 425. If the processing device determines that the memory bin for the current subblock is not in an early memory bin (e.g., determines that the current subblock is in a late memory bin), the method 400 proceeds to operation 435. Accordingly, the processing device applies an inner wordline partial block voltage offset to inner wordlines for all memory bins and boundary wordlines that belong to early memory bins. As explained with reference to FIG. 2, this reduces the risk of an unnecessary refresh operation when the LWP has not updated in buffer memory.

At operation 435, the processing device applies a boundary wordline partial block voltage offset. For example, voltage offset determination component 113 retrieves a voltage offset from local memory (e.g., local memory 119 of FIG. 1) for a boundary wordline of a partial block and performs a read operation on the current subblock using a read voltage (e.g., a full block read voltage) offset by the retrieved voltage offset. Further details regarding applying a boundary wordline partial block voltage offset are described with reference to FIG. 2.

At operation 440, the processing device determines whether the current subblock is the last subblock to be read. For example, voltage offset determination component 113 determines whether there is another subblock to read in the read command 205. If the processing device determines that the current subblock is the last subblock, the method 400 returns to operation 405 to process the next read command. If the processing device determines that the current subblock is not the last subblock, the method 400 proceeds to operation 445.

At operation 445, the processing device moves to the next subblock. For example, voltage offset determination component 113 proceeds to determine the memory bin for the following subblock of read command 205.

Figure 5:
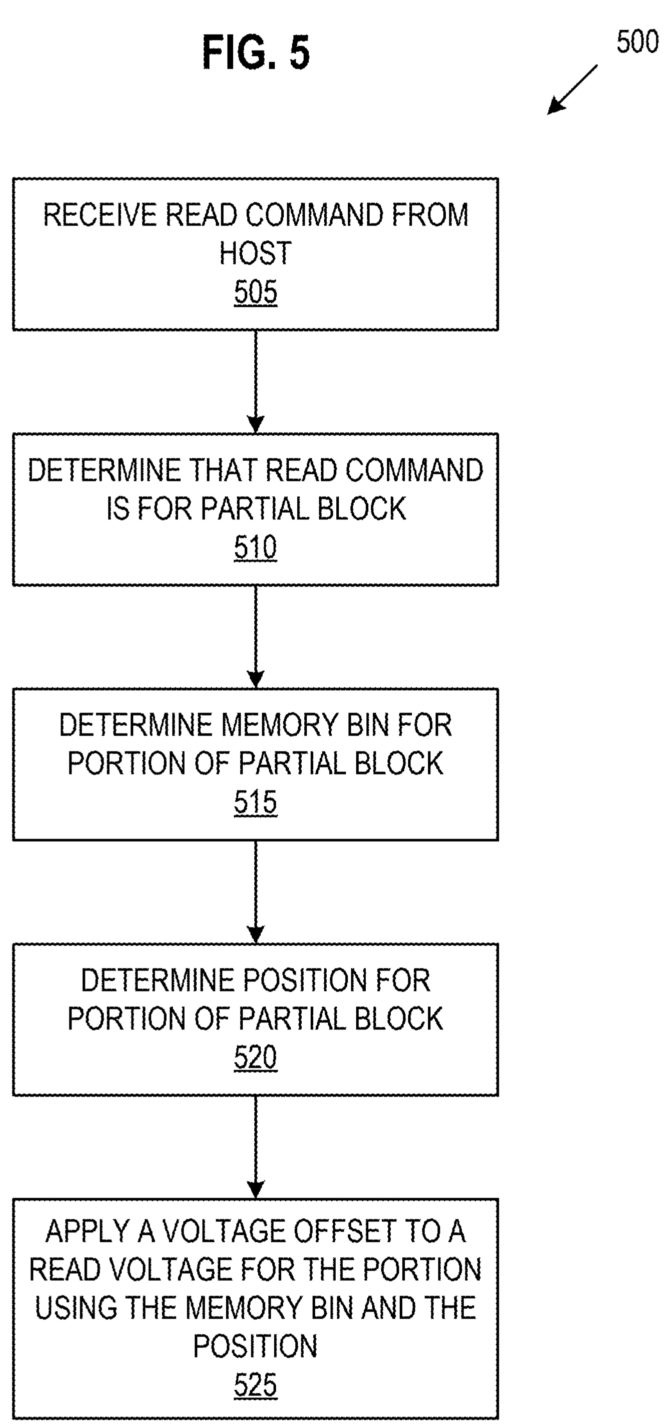
FIG. 5 is another flow diagram of an example method to determine voltage offsets using memory bins and memory positions in accordance with some embodiments of the present disclosure.

FIG. 5 is a flow diagram of an example method 500 to determine voltage offsets using memory bins and memory positions, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the voltage offset determination component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives a read command from a host system. For example, voltage offset determination component 113 receives read command 205 from host system 120. Further details regarding receiving a read command from a host system are described with reference to FIG. 2.

At operation 510, the processing device determines that the read command is for a partial block. For example, voltage offset determination component 113 retrieves a look-up table from local memory (e.g., local memory 119 of FIG. 1) and determines that memory block 210 is a partial block using the memory address for memory block 210 included in read command 205. Further details regarding determining that the read command is for a partial block are described with reference to FIG. 2.

At operation 515, the processing device determines a memory bin for a portion of the partial block. For example, voltage offset determination component 113 determines a memory bin for subblock 0 of memory block 210. In one embodiment, voltage offset determination component 113 retrieves a look-up table from local memory (e.g., local memory 119 of FIG. 1) and determines the memory bin using the memory address received in read command 205. Further details regarding determining a memory bin for a portion of the partial block are described with reference to FIGS. 2-4.

At operation 520, the processing device determines a position for a portion of the partial block relative to the unused portion of the partial block. For example, voltage offset determination component 113 determines whether subblock 0 belongs to a boundary wordline (e.g., third wordline 216) or an inner wordline (e.g., first wordline 212 or second wordline 214). Further details regarding determining a position for a portion of the partial block are described with reference to FIGS. 2-4.

At operation 525, the processing device applies a voltage offset to a read voltage for the portion using the memory bin and the position. For example, voltage offset determination component 113 retrieves a voltage offset from a look-up table stored in local memory (e.g., local memory 119 of FIG. 1) using the memory bin and the position. Voltage offset determination component 113 performs a read operation on subblock 0 using a read voltage (e.g., a full block read voltage) offset by the retrieved voltage offset. In some embodiments, the processing device applies multiple read strobes with different offsets based on the read strobe. For example, voltage offset determination component 113 retrieves voltage offsets for multiple levels of a read operation and performs the read operation by applying read voltages to different levels with the associated voltage offsets. Further details regarding applying a voltage offset to a read voltage for the portion using the memory bin and the position are described with reference to FIGS. 2-4.

Figure 6:
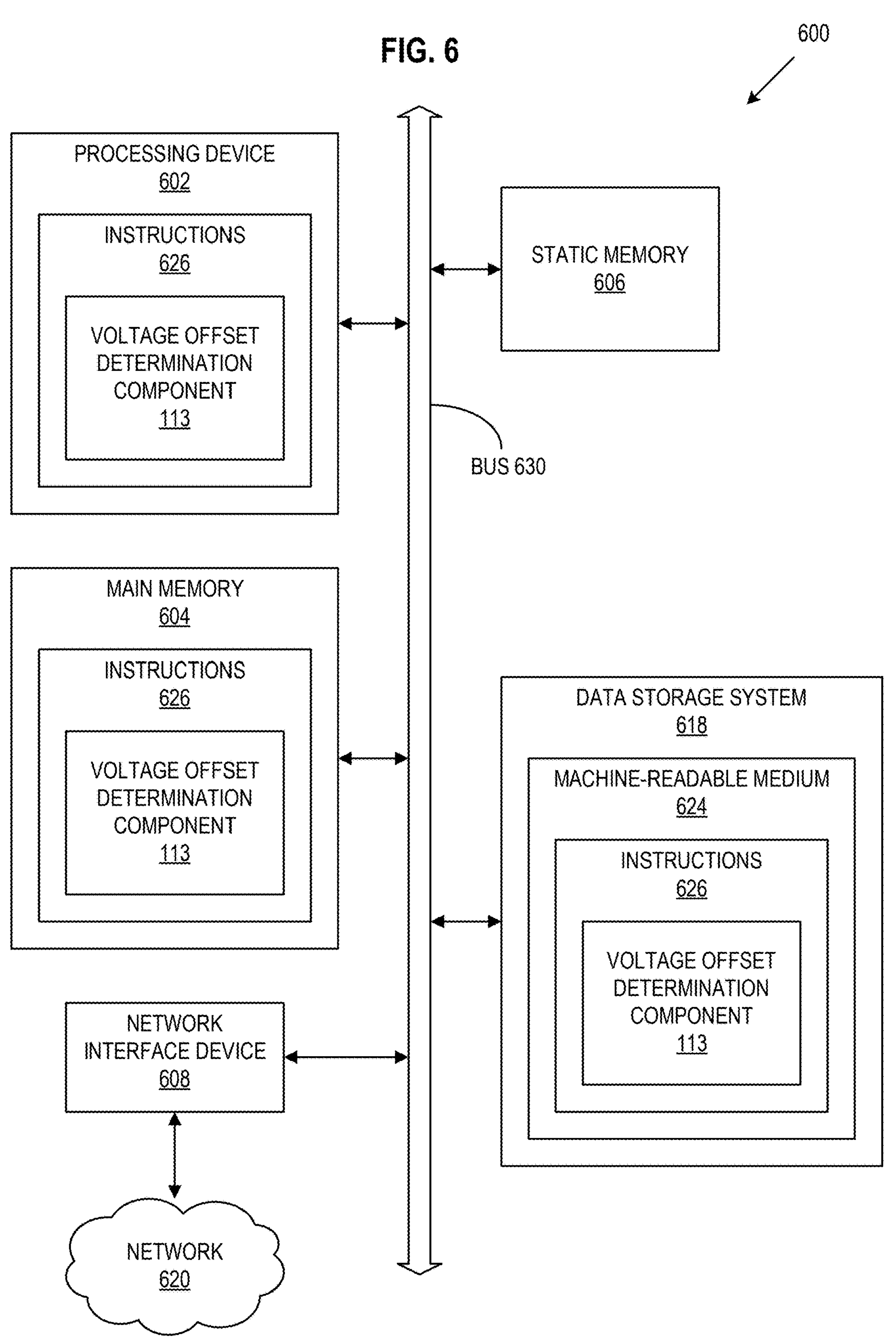
FIG. 6 is a block diagram of an example computer system in which embodiments of the present disclosure may operate.

FIG. 6 illustrates an example machine of a computer system 600 within which a set of instructions for causing the machine to perform any one or more of the methodologies discussed herein can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the voltage offset determination component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a smart device, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random-access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626, constituting machine-readable storage media, can also reside, completely or at least partially, within the main memory 604 and/or within the processing device 602 during execution thereof by the computer system 600, the main memory 604 and the processing device 602. The machine-readable storage medium 624, data storage system 618, and/or main memory 604 can correspond to the memory subsystem 10 of FIG. 1.

In one embodiment, the instructions 626 include instructions to implement functionality corresponding to a voltage offset determination component (e.g., voltage offset determination component 113 of FIG. 1). While the machine-readable storage medium 624 is shown in an example embodiment to be a single medium, the term "machine-readable storage medium" should be taken to include a single medium or multiple media that store the one or more sets of instructions (e.g., instructions 626). The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300, 400, and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random-access memories (RAMs), EPROMS, EEPROMs, magnetic or optical cards, or any type of media suitable for storing electronic instructions coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

receiving, by a memory subsystem, a read command from a host device to read data from a memory portion of the memory subsystem;

determining that the memory portion is included in a partial block;

determining a memory bin for the memory portion in response to determining that the memory portion is included in the partial block, wherein the memory bin comprises an early memory bin or a late memory bin, wherein an estimated charge loss for a memory portion of the early memory bin is less than an estimated charge loss for a memory portion of the late memory bin, and wherein the memory bin corresponds to an age of data stored in the memory portion;

determining a position for the memory portion within the partial block, wherein the position comprises an inner position or a boundary position of the memory portion within the partial block; and applying a voltage offset to a read voltage for the memory portion using the memory bin and the position, wherein the voltage offset is a first voltage offset if the position is the inner position or if the position is the boundary position and the memory bin is the early memory bin, wherein the voltage offset is a second voltage offset if the position is the boundary position and the memory bin is the late memory bin, and wherein the second voltage offset is greater than the first voltage offset.

2. The method of claim 1, wherein applying the voltage offset to the read voltage further uses a memory state level of the read voltage.

3. The method of claim 1, wherein the voltage offset is a third voltage offset if the position is the inner position and the memory bin is the late memory bin and wherein the first voltage offset is greater than the third voltage offset.

4. The method of claim 1, further comprising:

determining an updated age of data for the memory portion; and updating the memory bin using the updated age.

5. The method of claim 1, wherein the memory bin further corresponds to a temperature of the memory portion during storage of the data.

6. A non-transitory computer-readable storage medium comprising instructions that, when executed by a processing device, cause the processing device to:

receive, by a memory subsystem, a read command from a host device to read data from a memory portion of the memory subsystem;

determine that the memory portion is included in a partial block;

determine a memory bin for the memory portion in response to determining that the memory portion is included in the partial block, wherein the memory bin comprises an early memory bin or a late memory bin, wherein an estimated charge loss for a memory portion of the early memory bin is less than an estimated charge loss for a memory portion of the late memory bin, and wherein the memory bin corresponds to an age of data stored in the memory portion;

determine a position for the memory portion within the partial block, wherein the position comprises an inner position or a boundary position of the memory portion within the partial block; and apply a voltage offset to a read voltage for the memory portion using the memory bin and the position, wherein the voltage offset is a first voltage offset if the position is the inner position or if the position is the boundary position and the memory bin is the early memory bin, wherein the voltage offset is a second voltage offset if the position is the boundary position and the memory bin is the late memory bin, and wherein the second voltage offset is greater than the first voltage offset.

7. The non-transitory computer-readable storage medium of claim 6, wherein applying the voltage offset to the read voltage further uses a memory state level of the read voltage.

8. The non-transitory computer-readable storage medium of claim 6, wherein the voltage offset is a third voltage offset if the position is the inner position and the memory bin is the late memory bin and wherein the first voltage offset is greater than the third voltage offset.

9. The non-transitory computer-readable storage medium of claim 6, wherein the processing device is further to:

determine an updated age of data for the memory portion; and update the memory bin using the updated age.

10. The non-transitory computer-readable storage medium of claim 6, wherein the memory bin further corresponds to a temperature of the memory portion during storage of the data.

11. A system comprising:

a plurality of memory devices; and a processing device, operatively coupled with the plurality of memory devices, to:

receive, by a memory subsystem, a read command from a host device to read data from a memory portion of the memory subsystem;

determine that the memory portion is included in a partial block;

determine a memory bin for the memory portion in response to determining that the memory portion is included in the partial block, wherein the memory bin comprises an early memory bin or a late memory bin, wherein an estimated charge loss for a memory portion of the early memory bin is less than an estimated charge loss for a memory portion of the late memory bin, and wherein the memory bin corresponds to an age of data stored in the memory portion and a temperature of the memory portion during storage of the data;

determine a position for the memory portion within the partial block, wherein the position comprises an inner position or a boundary position of the memory portion within the partial block; and apply a voltage offset to a read voltage for the memory portion using the memory bin and the position, wherein the voltage offset is a first voltage offset if the position is the inner position or if the position is the boundary position and the memory bin is the early memory bin, wherein the voltage offset is a second voltage offset if the position is the boundary position and the memory bin is the late memory bin, and wherein the second voltage offset is greater than the first voltage offset.

12. The system of claim 11, wherein applying the voltage offset to the read voltage further uses a memory state level of the read voltage.

13. The system of claim 11, wherein the voltage offset is a third voltage offset if the position is the inner position and the memory bin is the late memory bin and wherein the first voltage offset is greater than the third voltage offset.

14. The system of claim 11, wherein the processing device is further to:

determine an updated age of data for the memory portion; and update the memory bin using the updated age.

* * * * *